(12) United States Patent
Jung et al.

(10) Patent No.: US 7,521,120 B2
(45) Date of Patent: Apr. 21, 2009

(54) NON-HALOGEN FLAME RETARDANT EPOXY RESIN COMPOSITION, AND PREPREG AND COPPER-CLAD LAMINATE USING THE SAME

(75) Inventors: Mok Yong Jung, Daejeon (KR); Eunhae Koo, Daejeon (KR)

(73) Assignee: LG Chem, Ltd. (KR)

( * ) Notice: Subject to any disclaimer, the term of this patent is extended or adjusted under 35 U.S.C. 154(b) by 421 days.

(21) Appl. No.: 11/284,610

(22) Filed: Nov. 22, 2005

(65) Prior Publication Data
US 2006/0160931 A1    Jul. 20, 2006

(30) Foreign Application Priority Data
Nov. 26, 2004   (KR) ............... 10-2004-0098230

(51) Int. Cl.
*B32B 15/092*    (2006.01)
*B32B 27/04*    (2006.01)
*B32B 27/38*    (2006.01)
*C08L 63/00*    (2006.01)

(52) U.S. Cl. ............... 428/416; 428/413; 428/414; 428/415; 428/417; 428/418; 523/427; 523/428; 523/433; 523/457; 523/458; 525/474; 525/476; 525/525; 525/538

(58) Field of Classification Search ............... None
See application file for complete search history.

(56) References Cited

U.S. PATENT DOCUMENTS

| 5,278,259 | A | * | 1/1994 | Futakuchi et al. | ............ 525/482 |
| 6,353,080 | B1 | | 3/2002 | Gan et al. | ............ 528/89 |
| 6,534,601 | B1 | * | 3/2003 | Park et al. | ............ 525/476 |
| 6,645,631 | B2 | * | 11/2003 | Gan et al. | ............ 428/413 |

FOREIGN PATENT DOCUMENTS

| DE | 43 08 184 A1 | 9/1994 |
| JP | 10-195178 | 7/1998 |
| JP | 2002-88139 | 3/2002 |
| JP | 2002-161197 | 6/2002 |

* cited by examiner

*Primary Examiner*—Michael J Feely
(74) *Attorney, Agent, or Firm*—Cantor Colburn LLP

(57) ABSTRACT

Provided are a non-halogen flame retardant epoxy resin composition comprising (A) a silicon-containing, phosphorus-modified epoxy resin, (B) a multifunctional epoxy resin, (C) a mixed curing agent of an amine curing agent and a phenolic curing agent and (D) a metal hydrate inorganic flame retardant, and a prepreg and copper-clad laminate using the same. The epoxy resin composition in accordance with the present invention exhibits excellent flame retardancy without use of a halogen flame retardant, and also advantageously provides well-balanced various physical properties which are to be required in copper-clad laminates, such as higher heat resistance and copper peel strength, and lead heat-resistant characteristics after moisture absorption.

8 Claims, No Drawings

NON-HALOGEN FLAME RETARDANT EPOXY RESIN COMPOSITION, AND PREPREG AND COPPER-CLAD LAMINATE USING THE SAME

FIELD OF THE INVENTION

The present invention relates to a non-halogen flame retardant epoxy resin composition for use in printed circuit boards (PCBs) and the like, and a prepreg and copper-clad laminate using the same.

BACKGROUND OF THE INVENTION

Recently, a great deal of attention has been directed to environmental concerns throughout the world, and many countries have strictly strengthened regulations on toxic substances associated with waste disposal of used electric/electronic products. In general, an epoxy resin composition uses a brominated bifunctional epoxy resin and multifunctional epoxy resin as main components and additionally an amine curing agent and cure accelerator, and in order to meet the standard for flammability of materials, i.e., Underwriters Laboratory flammability classification 94V-0, the epoxy resin composition contains 15 to 20% by weight of bromine. However, halogen compounds including bromine provide excellent flame retardancy, but cause generation of toxic gases when they are burned and the probable production of carcinogenic substance dioxin. As such, phosphorus or nitrogen containing compounds or flame retardant inorganic materials have been recently studied as replacements for bromine-containing flame retardants.

Methods involving an addition of a phosphorus flame retardant as the non-halogen flame retardant are most widely used in the art. For example, Japanese Patent Publication Laid-open Nos. 2002-88139, 2002-161191 and 2002-161197 disclose a composition containing a phosphorus compound and a nitrogen compound as a flame retardant. In addition, U.S. Pat. No. 6,353,080 and Japanese Patent Publication Laid-open No. 10-195178 disclose a technique involving reaction of an epoxy resin using a reactive phosphoric ester-based flame retardant. However, when a copper-clad laminate is prepared using the phosphorus-based flame retardant which was adopted in the above-mentioned patents, it was found that an unreacted phosphorus compound is very highly likely to lower lead heat resistance and copper peel strength. Germany Patent DE 43 08 184 solves such problems via formation of a bifunctional or multifunctional epoxy resin which was previously reacted with the phosphorus-based flame retardant, but disadvantageously suffers from relatively poor humidity resistance and heat resistance as compared to conventional products.

As such, conventional non-halogen epoxy resin compositions do not provide well-balanced various physical properties which are to be required in copper-clad laminates.

SUMMARY OF THE INVENTION

Therefore, the present invention has been made to solve the above problems, and other technical problems that have yet to be resolved.

As a result of a variety of extensive and intensive studies and experiments to solve the problems as described above, the inventors of the present invention have developed a non-halogen flame retardant epoxy resin composition comprising (A) a silicon-containing, phosphorus-modified epoxy resin, (B) a multifunctional epoxy resin, (C) a mixed curing agent of an amine curing agent and a phenolic curing agent, and (D) a metal hydrate inorganic flame retardant, and have found that such a composition does not result in an occurrence of poisonous carcinogenic substances such as dioxin when it is burned, by no use of a halogen flame retardant, alleviates shortcomings such as decreases in humidity resistance and heat resistance of phosphorus-based flame retardants, by use of the phosphorus-modified epoxy resin containing silicon, and provides improved copper peel strength. In addition, the present inventors have discovered that an addition of the metal hydrate inorganic flame retardant to the composition can ensure stable flame retardancy. The present invention has been completed based on these findings.

Specifically, it is an object of the present invention to provide a non-halogen flame retardant epoxy resin composition exhibiting excellent flame retardancy without production of carcinogenic substances upon thermal decomposition, and capable of realizing balanced physical properties such as excellent glass transition temperature (Tg), copper-clad adhesion, heat resistance, humidity resistance and flame retardancy stability.

It is another object of the present invention to provide a prepreg and copper-clad laminate prepared using the above-mentioned composition.

In accordance with an aspect of the present invention, the above and other objects can be accomplished by the provision of a non-halogen flame retardant epoxy resin composition, comprising (A) a silicon-containing, phosphorus-modified epoxy resin, (B) a multifunctional epoxy resin, (C) a mixed curing agent of an amine curing agent and a phenolic curing agent, and (D) a metal hydrate inorganic flame retardant.

Generally, conventional flame retardant epoxy resin compositions are confronted with a difficulty to achieve a balanced improvement in various physical properties thereof. Whereas, the present invention provides a non-halogen flame retardant epoxy resin composition capable of exerting desired physical properties via a combination of particular components. In addition, the present invention provides a prepreg and a copper-clad laminate, which are prepared using the above-mentioned composition.

DETAILED DESCRIPTION OF PREFERRED EMBODIMENTS

The present invention will now be described in more detail.

The present invention relates to an epoxy resin composition which can be used for preparation of a copper-clad laminate made up of a flame retardant glass fiber laminate having an epoxy resin impregnated therein.

The epoxy resin composition in accordance with the present invention contains a silicon-containing, phosphorus-modified epoxy resin simultaneously serving as a flame retardant and an epoxy resin, without using a conventional halogen flame retardant.

The silicon-containing, phosphorus-modified epoxy resin (A) contains more than 0.5% by weight of silicon in the phosphorus-modified epoxy resin.

Examples of the silicon-containing, phosphorus-modified epoxy resin include (i) a mixture of a non-silicon, phosphorus-modified epoxy resin and a silicon-containing compound and (ii) a phosphorus-modified epoxy resin containing silicon atoms in a molecular structure thereof.

In the compound of (i), a preferred example of the non-silicon, phosphorus-modified epoxy resin contains an epoxy resin represented by FORMULA I below:

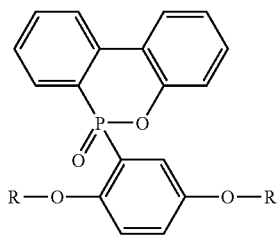

(I)

wherein each of R is independently a moiety of a bifunctional or multifunctional epoxy resin and is connected to the epoxy resin backbone via hydroxylation following the epoxy ring-opening.

Examples of the bifunctional or multifunctional epoxy resin include the followings:

<Bishphenol A Epoxy: FORMULA Ia>

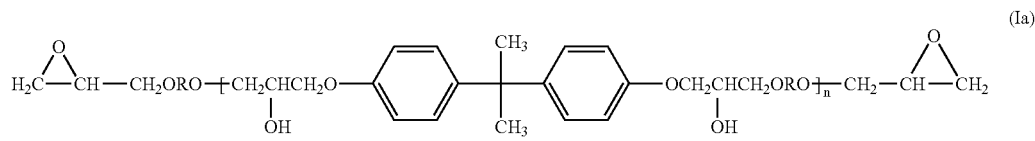

(Ia)

<Bishphenol A Novolac Epoxy: FORMULA Ib>

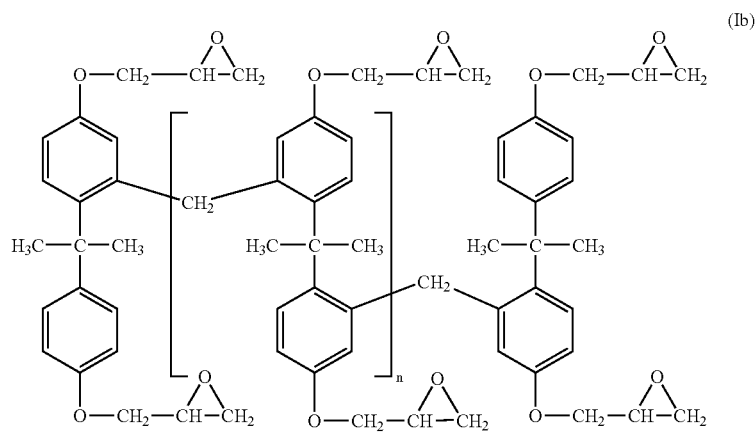

(Ib)

<Tetraphenyl Ethane Epoxy: FORMULA Ic>

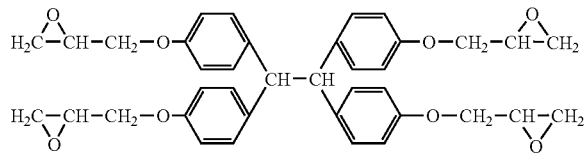

(Ic)

An example of the silicon-containing compound includes a silicon intermediate containing methoxy groups represented by FORMULA II:

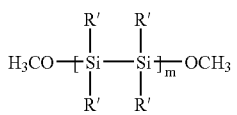

(II)

wherein each of R' is a benzyl group or methyl group.

The silicon intermediate containing methoxy groups has a specific gravity of 1.120 to 1.140 and a viscosity at 25° C. of 50 to 100 cps, and contains methoxy in an amount of 14.0 to 16.0% by weight.

In the compound of (ii), the phosphorus-modified epoxy resin containing silicon atoms in a molecular structure thereof may be obtained by polycondensation of the phosphorus-modified epoxy resin of FORMULA I with the silicon-containing compound.

An example of the phosphorus-modified epoxy resin containing silicon atoms in a molecular structure thereof may include a resin represented by FORMULA III:

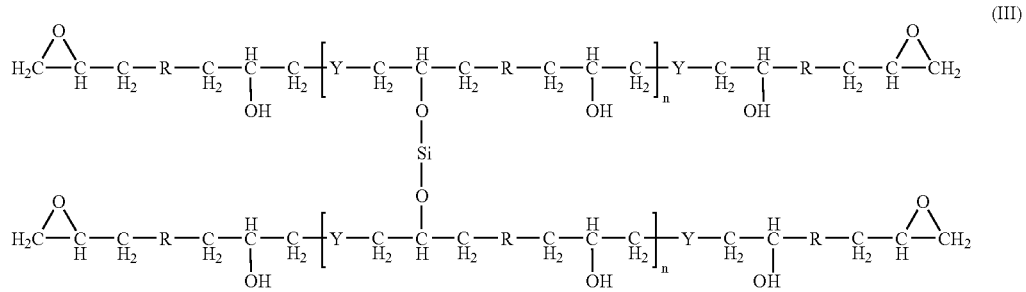

wherein Y is

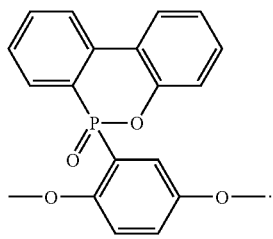

A phosphoric acid contained in the silicon-containing, phosphorus-modified epoxy resin of the present invention, when the resin is burned, forms carbides which then serve to block heat and oxygen, thereby imparting flame retardancy to a copper-clad laminate.

A blending amount of the silicon-containing, phosphorus-modified epoxy resin is adjusted to an amount such that a content of phosphorus in the total epoxy resin composition is preferably in a range of 1 to 8% by weight, and more preferably in a range of 2 to 4% by weight. Where the content of phosphorus in the total epoxy resin composition is less than 1% by weight, it is difficult to obtain sufficient flame retardancy. In contrast, where the content of phosphorus exceeds 8% by weight, this may lead to sharp deterioration in physical properties such as hygroscopicity, heat resistance and glass transition temperature.

An equivalent ratio of epoxy in the silicon-containing, phosphorus-modified epoxy resin is preferably in a range of 300 to 1500. The content of phosphorus in the silicon-containing, phosphorus-modified epoxy resin is preferably in a range of 2 to 5% by weight.

The silicon-containing, phosphorus-modified epoxy resin can achieve improvement of humidity resistance and heat resistance by silicon. In terms of humidity resistance and heat resistance, it is preferred that silicon atoms are chemically bound into phosphorus-modified epoxy resin molecules.

As the content of the epoxy group is higher, the silicon-containing, phosphorus-modified epoxy resin can be formed into a resin having a higher glass transition temperature. When the glass transition temperature is lower, the epoxy resin composition swells during a high-temperature manufacturing process and thus may be accompanied by disadvantages such as copper peeling and collapse of an inner layer.

The multifunctional epoxy resin (B) is an essential component to improve the glass transition temperature (Tg) and heat resistance of the epoxy resin composition in accordance with the present invention, and may include, for example trifunctional and tetrafunctional novolac resins. More preferred examples of such multifunctional epoxy resin include phenol novolac epoxy resin, cresol novolac epoxy resin, bisphenol A novolac epoxy resin and polyglycidyl amine epoxy resin.

The content of the multifunctional epoxy resin is preferably in a range of 20 to 100 parts by weight and more preferably in a range of 50 to 80 parts by weight, based on 100 parts by weight of the silicon-containing, phosphorus-modified epoxy resin. Where the content of the multifunctional epoxy resin is less than 20 parts by weight, sufficient elevation effects of the glass transition temperature (Tg) cannot be exerted. In contrast, where the content of the multifunctional epoxy resin exceeds 100 parts by weight, the content of phosphorus in the total resin composition is lowered, thereby resulting in production of a cured product having decreased flame retardancy and brittle properties.

As described hereinbefore, the epoxy resin curing agent (C) in accordance with the present invention is composed of a combination of an amine curing agent and a phenolic curing agent. Such a combination of curing agents enables control of a curing rate and achievement of balanced copper-clad adhesion, heat resistance and humidity resistance. More specifically, the amine curing agent compensates for poor copper-clad adhesion which is a disadvantage of the phenolic curing agent, while the phenolic curing agent serves to compensate for low heat resistance and humidity resistance which are disadvantages of the amine curing agent. That is, the combination of two curing agents compensate for disadvantages of each other, thereby improving physical properties of the resulting cured products. In addition, the amine curing agent can exert flame retardant effects via the presence of its own nitrogen components.

Examples of the amine curing agent include polyamine, polyamide, diaminodiphenylmethane and dicyandiamide. Generally, the amine curing agent dicyandiamide is widely used as the epoxy curing agent for the copper-clad laminate. As the amine curing agent that can be used in the present invention, dicyandiamide represented by FORMULA IV below is preferred:

In order to cure epoxy resin components, dicyandiamide should be added in an amount of at least more than 30%, relative to an epoxy equivalent. Addition of less than 30% dicyandiamide results in a very low curing rate. In contrast, where an amount of dicyandiamide added exceeds 80%, this may lead to deterioration of humidity resistance and heat resistance. Therefore, the added amount of dicyandiamide is preferably in a range of 30 to 80% and more preferably in a range of 40 to 60%, relative to an epoxy equivalent.

Preferred examples of the phenolic curing agent include a phenol novolac resin and a triazine-modified novolac resin. A higher amount of the phenol novolac resin added leads to a decrease in the content of phosphorus in the total resin composition, whereas a higher amount of the triazine-modified novolac resin leads to deterioration of physical properties such as heat resistance and humidity resistance.

A preferred example of the phenolic curing agent in accordance with the present invention is a bisphenol novolac represented by FORMULA V below:

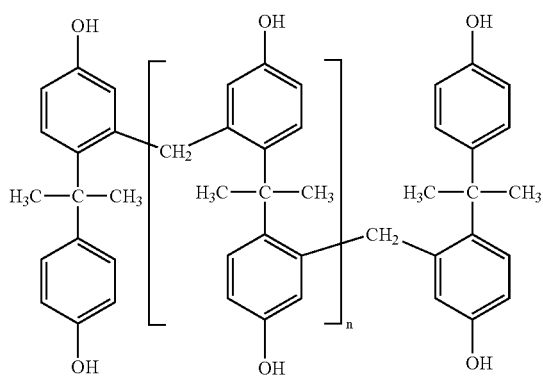

(V)

A content of the phenolic curing agent is preferably in a range of 5 to 40% and more preferably in a range of 5 to 20%, relative to an epoxy equivalent. Where the content of the phenolic curing agent is below 5%, a curing rate is too low and thus it is impossible to obtain a laminate having a uniform thickness upon molding a prepreg. In contrast, the content of the phenolic curing agent exceeds 40%, a curing rate is too high and thus it is impossible to ensure storage stability of the prepreg.

An equivalent ratio of an amine component:phenolic component in the curing agent is preferably in a range of 90:10 to 40:60, and more preferably in a range of 80:20 to 60:40. Where the equivalent ratio of the amine curing agent exceeds 90%, this may result in problems associated with deterioration of lead heat resistance and humidity resistance. Where the equivalent ratio of the amine curing agent is less than 40%, it is undesirable in that a curing rate is too short and the glass transition temperature (Tg) is lowered.

The metal hydrate inorganic flame retardant (D) is a component capable of providing desired flame retardancy when it is used in conjunction with a polymeric material. There is no particular limit to the metal hydrate inorganic flame retardant, so long as it is a non-halogen inorganic material capable of imparting flame retardancy. Examples of such a non-halogen inorganic material may include aluminum hydroxide, magnesium hydroxide, aluminum hydroxide/zinc stannate and aluminum hydroxide/zinc molybdate. These materials may be used alone or in any combination thereof.

A content of the inorganic flame retardant is preferably in a range of 20 to 100 parts by weight and more preferably in a range of 30 to 60 parts by weight, based on 100 parts by weight of the total resin composition. Where the content of the inorganic flame retardant is less than 20 parts by weight, it is difficult to obtain desired flame retardancy. In contrast, where the content of the inorganic flame retardant is greater than 100 parts by weight, it is undesirable in that copper-clad adhesion may be decreased.

The epoxy resin composition in accordance with the present invention may further contain other components, as long as the effects of the present invention are not degraded.

For instance, the composition may further contain a cure accelerator in order to promote curing. An imidazole cure accelerator is preferred as such an epoxy cure accelerator. Examples of the imidazole-based cure accelerator include imidazoles and imidazole derivatives such as 1-methylimidazole, 2-methylimidazole, 2-ethyl-4-methylimidazole, 2-phenylimidazole, 2-cyclohexyl-4-methylimidazole, 4-butyl-5-ethylimidazole, 2-methyl-5-ethylimidazole, 2-octyl-4-hexylimidazole, 2,5-chloro-4-ethylimidazole and 2-butoxy-4-allyl imidazole. 2-phenylimidazole is particularly preferred in terms of excellent reaction stability and inexpensiveness. A content of imidazole is preferably in a range of 0.1 to 10 parts by weight and more preferably in a range of 0.2 to 5 parts by weight, based on 100 parts by weight of the epoxy resin components.

In order to control a curing rate and improve a glass transition temperature (Tg), the composition may further contain a cure retarder, in conjunction with the above-mentioned imidazole. Specific examples of the cure retarder which can be used in the present invention include boric acid, salicylic acid, hydrochloric acid, sulfuric acid, oxalic acid, terephthalic acid, isophthalic acid, phosphoric acid and lactic acid. An amount of the cure retarder to be used is preferably in a range of 0.1 to 10 molar equivalents and more preferably in a range of 0.5 to 5 molar equivalents, based on a molar equivalent of the imidazole cure accelerator.

Further, the present invention provides a prepreg comprising 40 to 70 parts by weight of the above-mentioned non-halogen flame retardant epoxy resin composition within 30 to 60 parts by weight of a glass fiber, and provides a copper-clad laminate in which one or more laminates composed of the prepreg are integrated with outer layers made up of conductive sheets (for example, copper-clad) located outside the laminates via heating and pressing.

A method for preparing a prepreg using a resin composition and glass fiber and a method for preparing a copper-clad laminate using such a prepreg are well-known in the art and therefore details thereof will be omitted herein. In this connection, specific examples of such methods can be confirmed through Experimental Examples which will be illustrated hereinafter.

EXAMPLES

Now, the present invention will be described in more detail with reference to the following examples. These examples are provided only for illustrating the present invention and should not be construed as limiting the scope and spirit of the present invention.

Example 1

A non-halogen flame retardant epoxy resin composition was prepared according to the following composition formula as set forth in Table 1.

First, 9 parts by weight of dicyandiamide was introduced to a 1000 mL beaker, and 120 parts by weight of methyl cellosolve were then added thereto and completely dissolved. 500 parts by weight of a silicon-containing, phosphorus-modified epoxy resin (see FORMULA III), 25 parts by weight of a tetrafunctional epoxy resin (see FORMULA Ic), 30 parts by weight of a phenol novolac curing agent (see FORMULA V) and 0.6 parts by weight of 2-phenylimidazole were added to the resulting solution and stirred until they were completely dissolved and mixed, thereby preparing an epoxy resin composition.

Thereafter, 100 parts by weight of aluminum hydroxide was added to the thus-prepared epoxy resin composition and methyl cellosolve was then added such that a concentration of a non-volatile component was adjusted to 60 parts by weight. Then, the resulting solution was sufficiently stirred using a high speed stirrer. Herein, contents of phosphorus and nitrogen components in the total resin composition were adjusted to 2.7% by weight and 0.8% by weight, respectively.

Example 2

A non-halogen epoxy resin composition was prepared according to the following composition formula as set forth in Table 1.

First, 14 parts by weight of dicyandiamide was introduced to a 1000 mL beaker and 200 parts by weight of methyl cellosolve were then added thereto and completely dissolved. 500 parts by weight of a silicon-containing, phosphorus-modified epoxy resin (see FORMULA III), 25 parts by weight of a tetrafunctional epoxy resin (see FORMULA Ic), 200 parts by weight of a bisphenol A novolac epoxy resin (see FORMULA Ic), 40 parts by weight of a phenol novolac curing agent (see FORMULA V) and 0.6 parts by weight of 2-phenylimidazole were added to the resulting solution and stirred until they were completely dissolved and mixed, thereby preparing an epoxy resin composition.

Thereafter, 200 parts by weight of aluminum hydroxide was added to the thus-prepared epoxy resin composition and methyl cellosolve was then added such that a concentration of a non-volatile component was adjusted to 60 parts by weight. Then, the resulting solution was sufficiently stirred using a high speed stirrer. Herein, an epoxy resin composition was prepared in which contents of phosphorus and nitrogen components in the total resin composition (excluding a filler component) were 1.9% by weight and 0.9% by weight, respectively.

Example 3

A non-halogen epoxy resin composition was prepared in the same manner as Example 2, except that contents of a bisphenol A novolac epoxy resin, aluminum hydroxide, and dicyandiamide and phenol novolac curing agents were changed as set forth in Table 1 below.

Examples 4 through 6

A non-halogen epoxy resin composition was prepared in the same manner as Example 2, except that contents of a tetrafunctional epoxy resin, bisphenol A novolac epoxy resin, and dicyandiamide and phenol novolac curing agents were changed as set forth in Table 2 below.

Comparative Example 1

An epoxy resin composition was prepared in the same manner as Example 1, except that a dicyandiamide curing agent was used alone and a content of aluminum hydroxide was changed as set forth in Table 3 below.

Comparative Example 2

An epoxy resin composition was prepared in the same manner as Example 1, except that a phenol novolac curing agent was used alone and a content of aluminum hydroxide was changed as set forth in Table 3 below.

Comparative Example 3

An epoxy resin composition was prepared in the same manner as Example 2, except that contents of dicyandiamide and phenol novolac curing agents were changed as set forth in Table 3 below.

Comparative Example 4

An epoxy resin composition was prepared in the same manner as Example 2, except that contents of a silicon-containing, phosphorus-modified epoxy resin, aluminum hydroxide, and dicyandiamide and phenol novolac curing agents were changed as set forth in Table 4 below.

Comparative Example 5

An epoxy resin composition was prepared in the same manner as Example 2, except that a composition formula given in Table 4 below was used without addition of aluminum hydroxide, in order to realize flame retardancy with a silicon-containing, phosphorus-modified epoxy resin alone.

Experimental Example 1

Preparation of Copper-Clad Laminate

Epoxy resin compositions prepared in Examples 1 through 6 and Comparative Examples 1 through 5 were impregnated in glass fibers (7628, manufactured by Nittobo) and subjected to hot air drying, thereby preparing glass fiber prepregs containing a resin in an amount of 43% by weight.

8 sheets of the thus-prepared glass fiber prepregs were stacked and copper-foils having a thickness of 35 μm were stacked on both sides of the respective prepregs, followed by heating and pressing at 195° C. under a pressure of 40 kg/cm$^2$ for 90 min using a press, thereby preparing copper-clad laminates having a thickness of 1.6 mm.

Experimental Example 2

Evaluation of Copper-Clad Laminate
  Glass transition temperature (Tg): A copper-clad layer of the copper-clad laminate was removed by etching and the glass transition temperature (Tg) was measured via use of a differential scanning calorimeter (DSC).
  Copper peel strength: A copper-cladding having a width of 1 cm was peeled from the surface of the copper-clad laminate and the peel strength thereof was measured using a texture analyzer.
  Lead heat resistance: A sample having a thickness of 1.6 mm, cut to a size of 5 cm×5 cm, was placed on a lead bath at 288° C. and then, a withstanding time thereof was measured, thereby determining lead heat resistance.
  Lead heat resistance after moisture absorption: A sample having a thickness of 1.6 mm, cut to a size of 5 cm×5 cm, was subjected to steam treatment at a temperature of 120° C. under a pressure of 2 atm for 2 hours, and was dipped in a lead bath at 288° C. for 10 sec. The presence/absence of the measling phenomenon in the sample was observed and the sample was evaluated on the basis of the following criteria:
  ◎: No measling
  ○: Partial measling
  Δ: Almost measling
  X: Entirely measling Flame retardancy: Bar-shaped specimens were prepared using laminates from which a copper cladding was removed, and were subjected to UL94 testing, a flammability test method in which a flammability (flame-retardant property) of the substance is rated as V-0, V-1 and V-2 by a vertical burning test.

TABLE 1

| | | Ex. 1 | Ex. 2 | Ex. 3 |
|---|---|---|---|---|
| Resin composition (phr) | Silicon-containing, phosphorus-modified epoxy resin | 500 | 500 | 500 |
| | Tetrafunctional epoxy resin | 25 | 25 | 25 |
| | Bisphenol A novolac epoxy resin | — | 200 | 330 |
| | Aluminum hydroxide | 100 | 200 | 330 |
| | Dicyandiamide | 9 | 14 | 16 |
| | Phenol novolac curing agent | 30 | 40 | 60 |
| | 2-phenylimidazole | 0.6 | 0.6 | 0.6 |
| Phosphorus content (wt %) | | 2.7 | 1.9 | 1.6 |
| Nitrogen content (wt %) | | 0.8 | 0.9 | 0.9 |
| Physical properties | Varnish gel time (sec) @170° C. | 240 | 200 | 360 |
| | DSC Tg (° C.) | 130 | 142 | 152 |
| | Copper peel strength (kN/m) | 2.0 | 1.7 | 1.6 |
| | Lead heat resistance (sec) @288° C. | 480 | 360 | 420 |
| | Lead heat resistance @288° C. after moisture absorption | ○○△ | ○○△ | ○△△ |
| | Flammability (UL94) | V-0 | V-0 | V-0 |

TABLE 2

| | | Ex. 4 | Ex. 5 | Ex. 6 |
|---|---|---|---|---|
| Resin composition (phr) | Silicon-containing, phosphorus-modified epoxy resin | 500 | 500 | 500 |
| | Tetrafunctional epoxy resin | 50 | 100 | 150 |
| | Bisphenol A novolac epoxy resin | 200 | 150 | 100 |
| | Aluminum hydroxide | 200 | 200 | 200 |
| | Dicyandiamide | 15 | 20 | 20 |
| | Phenol novolac curing agent | 15 | 25 | 25 |
| | 2-phenylimidazole | 0.6 | 0.6 | 0.6 |
| Phosphorus content (wt %) | | 2.7 | 1.8 | 1.8 |
| Nitrogen content (wt %) | | 0.8 | 0.9 | 0.9 |
| Physical properties | Varnish gel time (sec) @170° C. | 260 | 300 | 320 |
| | DSC Tg (° C.) | 148 | 155 | 158 |
| | Copper peel strength (kN/m) | 1.6 | 1.6 | 1.5 |
| | Lead heat resistance (sec) @288° C. | 540 | 300 | 280 |
| | Lead heat resistance @288° C. after moisture absorption | ○○○ | ○△△ | △△△ |
| | Flammability (UL94) | V-0 | V-0 | V-0 |

As can be seen from Tables 1 and 2, Examples 1 through 6 in accordance with the present invention exhibited good flame retardancy and excellent copper peel strength and lead heat resistance. In addition, as contents of multifunctional epoxy resins (tetrafunctional epoxy resin and bisphenol A novolac epoxy resin) were higher, particularly when a content of the tetrafunctional epoxy resin was increased, the glass transition temperature (Tg) was shown to be improved.

TABLE 3

| | | Comp. Ex. 1 | Comp. Ex. 2 | Comp. Ex. 3 |
|---|---|---|---|---|
| Resin composition (phr) | Silicon-containing, phosphorus-modified epoxy resin | 500 | 500 | 500 |
| | Tetrafunctional epoxy resin | 25 | 25 | 25 |
| | Bisphenol A novolac epoxy resin | — | — | — |
| | Aluminum hydroxide | 200 | 200 | 200 |
| | Dicyandiamide | 20 | — | 5 |
| | Phenol novolac curing agent | — | 80 | 35 |
| | 2-phenylimidazole | 0.6 | 0.6 | 0.6 |
| Phosphorus content (wt %) | | 2.8 | 2.5 | 2.6 |
| Nitrogen content (wt %) | | 1.8 | — | 0.4 |
| Physical properties | Varnish gel time (sec) @170° C. | 540 | 140 | 175 |
| | DSC Tg (° C.) | 135 | 128 | 131 |
| | Copper peel strength (kN/m) | 2.1 | 1.8 | 1.9 |
| | Lead heat resistance (sec) @288° C. | 170 | 960 | 860 |
| | Lead heat resistance @288° C. after moisture absorption | △XX | ○○○ | ○○○ |
| | Flammability (UL94) | V-0 | V-0 | V-0 |

TABLE 4

| | | Comp. Ex. 4 | Comp. Ex. 5 |
|---|---|---|---|
| Resin composition (phr) | Silicon-containing, phosphorus-modified epoxy resin | 200 | 500 |
| | Tetrafunctional epoxy resin | 25 | 25 |
| | Bisphenol A novolac epoxy resin | 200 | 200 |
| | Aluminum hydroxide | 500 | — |
| | Dicyandiamide | 10 | 14 |
| | Phenol novolac curing agent | 25 | 40 |
| | 2-phenylimidazole | 0.5 | 0.6 |
| Phosphorus content (wt %) | | 2.8 | 1.9 |
| Nitrogen content (wt %) | | 1.8 | 0.9 |
| Physical properties | Varnish gel time (sec) @170° C. | 180 | 195 |
| | DSC Tg (° C.) | 158 | 145 |
| | Copper peel strength (kN/m) | 1.3 | 2.0 |
| | Lead heat resistance (sec) @288° C. | 150 | 780 |
| | Lead heat resistance @288° C. after moisture absorption | XXX | ○○○ |
| | Flammability (UL94) | V-0 | V-1 |

As can be seen from Tables 3 and 4, Comparative Example 1, in which a dicyandiamide curing agent was used alone in the non-halogen epoxy resin composition, exhibited excellent copper peel strength, but showed deterioration of a lead heat resistance and humidity resistance. Whereas, Comparative Example 2, in which a phenol novolac curing agent was used alone, and Comparative Example 3, in which dicyandiamide and phenol novolac curing agents were used in an equivalent ratio of 15:85, exhibited excellent lead heat resistance and humidity resistance, but showed a very short curing time of varnish and a lowered glass transition temperature (Tg).

In addition, it can be confirmed that Comparative Example 4, in which a content of the silicon-containing, phosphorus-modified epoxy resin was sharply decreased and a content of aluminum hydroxide was greatly increased in order to make up for flame retardancy, exhibited good flame retardancy, but showed decreases in copper peel strength and lead heat resistance. In the case of Comparative Example 5 in which the silicon-containing, phosphorus-modified epoxy resin alone was used to obtain desired flame retardancy without use of aluminum hydroxide, it was shown that flame retardancy of the composition was decreased to V-1 rating.

INDUSTRIAL APPLICABILITY

A non-halogen epoxy resin composition in accordance with the present invention does not result in an occurrence of toxic carcinogenic substances such as dioxin upon burning, due to use of a non-halogen flame retardant, alleviates disadvantages such as decreases in heat resistance and copper peel strength exhibited by phosphorus-based flame retardants, due to use of a silicon-containing, phosphorus-modified epoxy resin, improves a glass transition temperature (Tg), due to use of a multifunctional epoxy resin, and simultaneously provides balanced various physical properties which are to be required in copper-clad laminates, due to use of a metal hydrate inorganic flame retardant in order to compensate for decreased flame retardancy resulting from an increased content of the multifunctional epoxy resin.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A non-halogen flame retardant epoxy resin composition, comprising:
    (A) a silicon-containing, phosphorus-modified epoxy resin having an average epoxy equivalent of 300 to 1500 and containing phosphorus in an amount of 2 to 5% by weight, wherein the silicon-containing, phosphorus-modified epoxy resin is: a) a mixture of a non-silicon, phosphorus-modified epoxy resin and a silicon-containing compound; or b) a phosphorus-modified epoxy resin containing silicon atoms in a molecular structure thereof;
    (B) 20 to 100 parts by weight of a multifunctional epoxy resin, relative to the silicon-containing, phosphorus-modified epoxy resin wherein the multifunctional epoxy resin comprises a combination of tetraphenyl ethane epoxy resin and a bisphenol A novolac epoxy resin;
    (C) a 35 to 120% mixed curing agent of an amine curing agent and a phenolic curing agent, relative to the epoxy equivalent; and
    (D) 20 to 100 parts by weight of a metal hydrate inorganic flame retardant, relative to the resin composition.

2. The composition according to claim 1, wherein the silicon-containing, phosphorus-modified epoxy resin contains a phosphorus-modified epoxy resin having a structure represented by FORMULA I and contains more than 0.5% by weight of silicon:

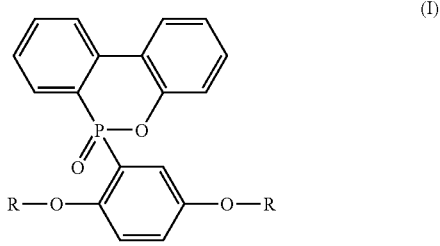

wherein each of R is independently a moiety of a bifunctional or multifunctional epoxy resin and is connected to the epoxy resin backbone via hydroxylation following the epoxy ring-opening.

3. The composition according to claim 1, wherein the amine curing agent is dicyandiamide.

4. The composition according to claim 1, wherein the phenolic curing agent is a phenol novolac curing agent 5. The composition according to claim 1, wherein the metal hydrate inorganic flame retardant is aluminum hydroxide.

6. The non-halogen flame retardant epoxy resin composition of claim 1, wherein the equivalent ratio of amine component:phenolic component in the mixed curing agent is in a range of 90:10 to 40:60.

7. A prepreg comprising 40 to 70 parts by weight of the non-halogen flame retardant epoxy resin composition of claim 1 within 30 to 60 parts by weight of a glass fiber.

8. A copper-clad laminate in which one or more laminates composed of the prepreg of claim 7 are integrated with copper-clad outer layers located outside the laminates via heating and pressing.

* * * * *